United States Patent
Isaac et al.

(10) Patent No.: US 9,817,025 B2
(45) Date of Patent: *Nov. 14, 2017

(54) WAVEGUIDES FOR CAPTURING CLOSE-PROXIMITY ELECTROMAGNETIC RADIATION TRANSMITTED BY WIRELESS CHIPS DURING TESTING ON AUTOMATED TEST EQUIPMENT (ATE)

(71) Applicant: Keyssa, Inc., Campbell, CA (US)

(72) Inventors: Roger Isaac, San Jose, CA (US); Bhupendra Sarhad, Pleasanton, CA (US); Gary Davis McCormack, Tigard, OR (US); Ian A. Kyles, West Linn, OR (US); Frederick George Weiss, Newberg, OR (US); Christopher Scott Sansom, Santa Clara, CA (US)

(73) Assignee: Keyssa, Inc., Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/429,117

(22) Filed: Feb. 9, 2017

(65) Prior Publication Data

US 2017/0160310 A1    Jun. 8, 2017

Related U.S. Application Data

(63) Continuation of application No. 14/108,708, filed on Dec. 17, 2013, now Pat. No. 9,588,173.

(51) Int. Cl.
   *G01R 1/04* (2006.01)
   *G01R 31/28* (2006.01)
   *G01R 1/24* (2006.01)

(52) U.S. Cl.
   CPC .............. *G01R 1/045* (2013.01); *G01R 1/24* (2013.01); *G01R 31/2822* (2013.01); *G01R 31/2834* (2013.01); *G01R 31/2889* (2013.01)

(58) Field of Classification Search
   None
   See application file for complete search history.

(56) References Cited

U.S. PATENT DOCUMENTS

| 5,262,355 A | 11/1993 | Nishiguchi et al. |
| 6,201,403 B1 | 3/2001 | Rollin et al. |
| (Continued) | | |

FOREIGN PATENT DOCUMENTS

| KR | 10-2010-0111278 A | 10/2010 |
| WO | WO 2013/130486 A1 | 9/2013 |

OTHER PUBLICATIONS

U.S. Office Action, U.S. Appl. No. 14/108,708, dated May 26, 2016, 17 pages.

(Continued)

*Primary Examiner* — Melissa Koval
*Assistant Examiner* — Nasima Monsur
(74) *Attorney, Agent, or Firm* — Fenwick & West LLP

(57) ABSTRACT

A test fixture has a flexible plastic cable that acts as a waveguide. The Device-Under-Test (DUT) is a small transceiver and antenna that operate in the Extremely High-Frequency (EHF) band of 30-300 GHz. The size of the DUT transceiver is very small, limiting the power of emitted electromagnetic radiation so that close-proximity communication is used. The envelope for reception may only extend for about a centimeter from the DUT transceiver, about the same size as the test socket. A slot is formed in the test socket very near to the antenna. The slot receives one end of the plastic waveguide. The slot extends into the envelope by the DUT transceiver so that close-proximity radiation is captured by the plastic waveguide. The waveguide has a high relative permittivity and reflective metalized walls so that the radiation may be carried to a receiver that is outside the envelope.

20 Claims, 14 Drawing Sheets

(56) References Cited

U.S. PATENT DOCUMENTS

| | | |
|---|---|---|
| 7,915,909 B2 | 3/2011 | Dunn et al. |
| 8,193,819 B2 | 6/2012 | Wang et al. |
| 8,436,777 B2 | 5/2013 | Ito et al. |
| 9,588,173 B2 * | 3/2017 | Isaac .................. G01R 31/2889 |
| 2007/0063914 A1 | 3/2007 | Becker |
| 2007/0164755 A1 | 7/2007 | Stojcevic |
| 2009/0051366 A1 | 2/2009 | Miyauchi et al. |
| 2009/0115440 A1 | 5/2009 | Bergmann |
| 2009/0153158 A1 * | 6/2009 | Dunn ................ G01R 31/2822 |
| | | 324/762.01 |
| 2009/0189623 A1 | 7/2009 | Campbell |
| 2010/0171669 A1 * | 7/2010 | Ito .......................... G01R 29/10 |
| | | 343/703 |
| 2010/0207638 A1 | 8/2010 | Nien et al. |
| 2010/0283476 A1 | 11/2010 | Shen |
| 2011/0080187 A1 | 4/2011 | Hotz et al. |
| 2011/0169117 A1 | 7/2011 | McIntosh et al. |
| 2012/0126821 A1 | 5/2012 | Forstner |
| 2012/0176150 A1 | 7/2012 | Hsu et al. |
| 2012/0268153 A1 | 10/2012 | Nickel et al. |
| 2012/0293379 A1 | 11/2012 | Nickel et al. |
| 2013/0093447 A1 | 4/2013 | Nickel et al. |
| 2013/0293249 A1 * | 11/2013 | Han ........................ G01R 1/045 |
| | | 324/750.02 |
| 2015/0168486 A1 | 6/2015 | Isaac et al. |

OTHER PUBLICATIONS

U.S. Office Action, U.S. Appl. No. 14/108,708, dated Jan. 6, 2016, 18 pages.
PCT International Search Report and Written Opinion, PCT Application No. PCT/US2013/075600, dated Apr. 4, 2014, 7 pages.
PCT International Search Report and Written Opinion, PCT Application No. PCT/US2016/054966, dated Jan. 13, 2017, 10 pages.
European Extended Search Report, European Application No. 13899714.3, dated Jul. 31, 2017, 8 pages.

* cited by examiner

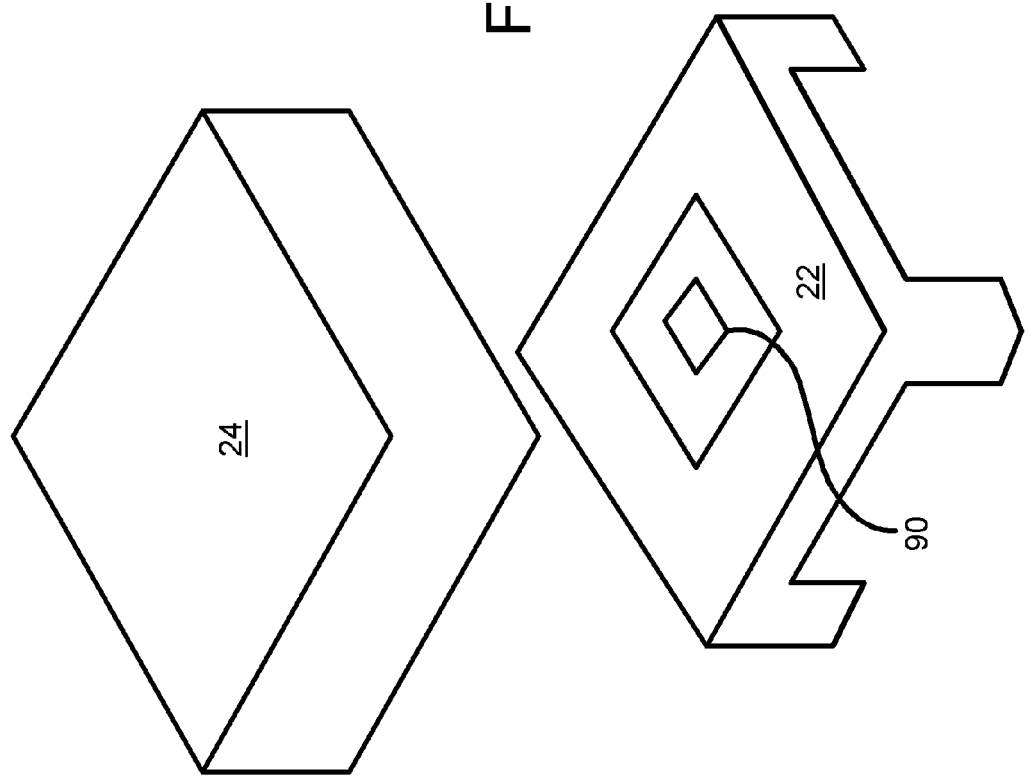

TOP VIEW

SIDE VIEW

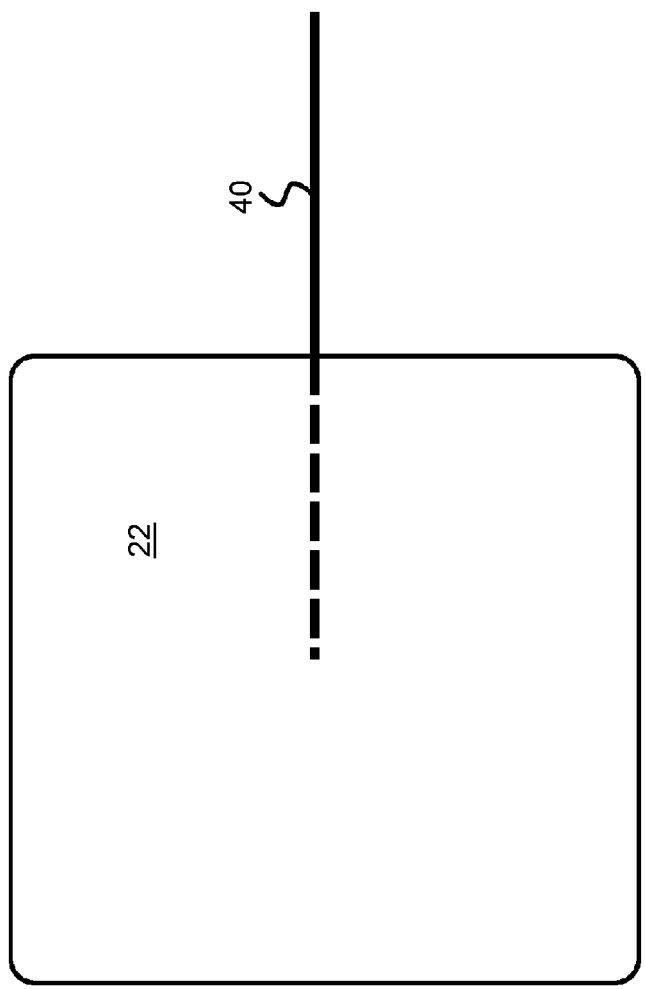
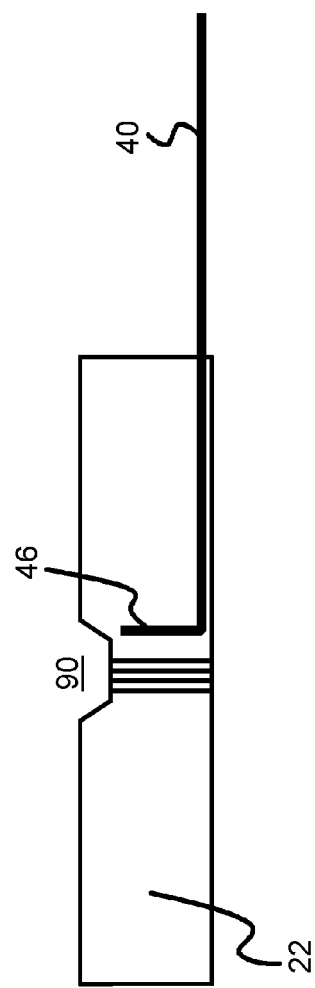

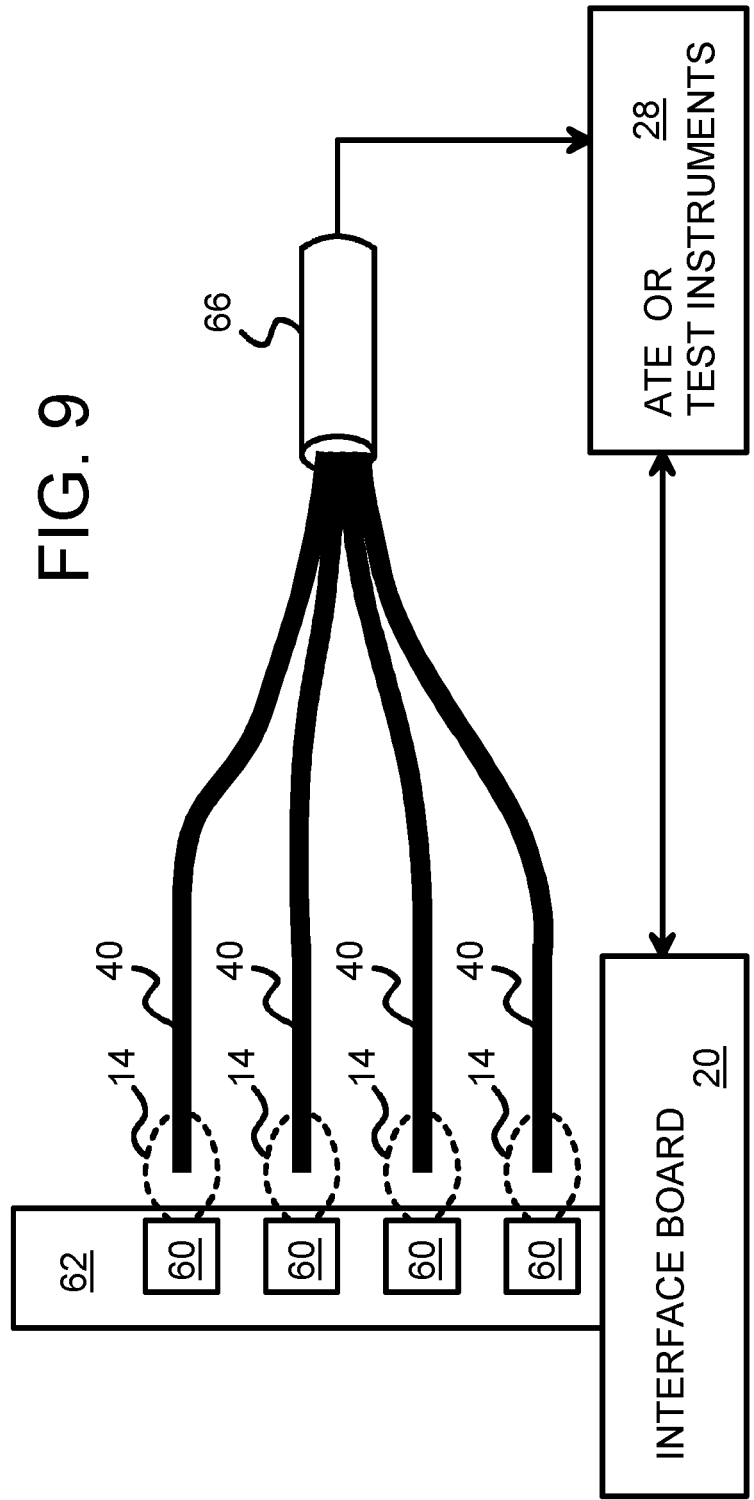

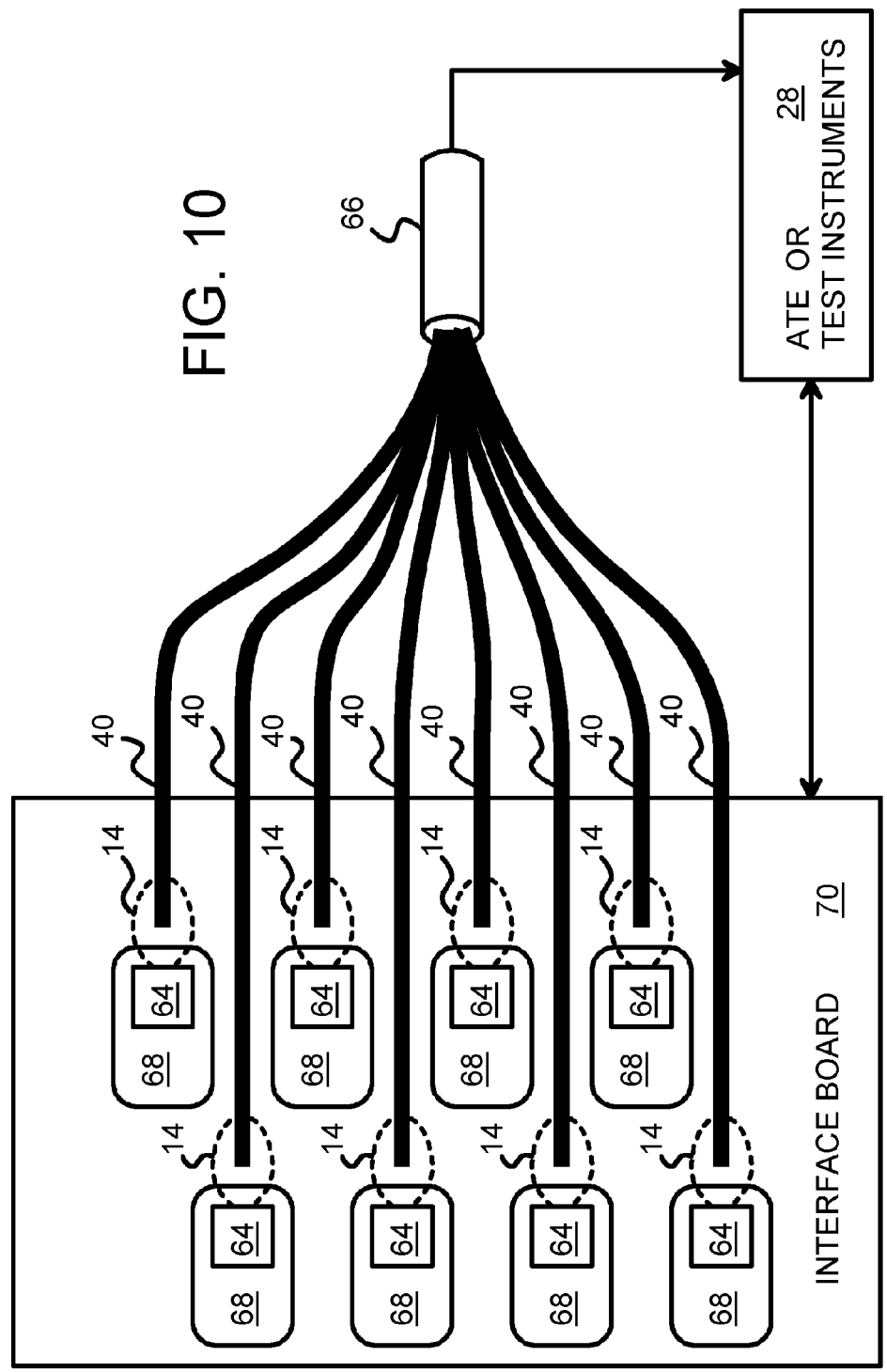

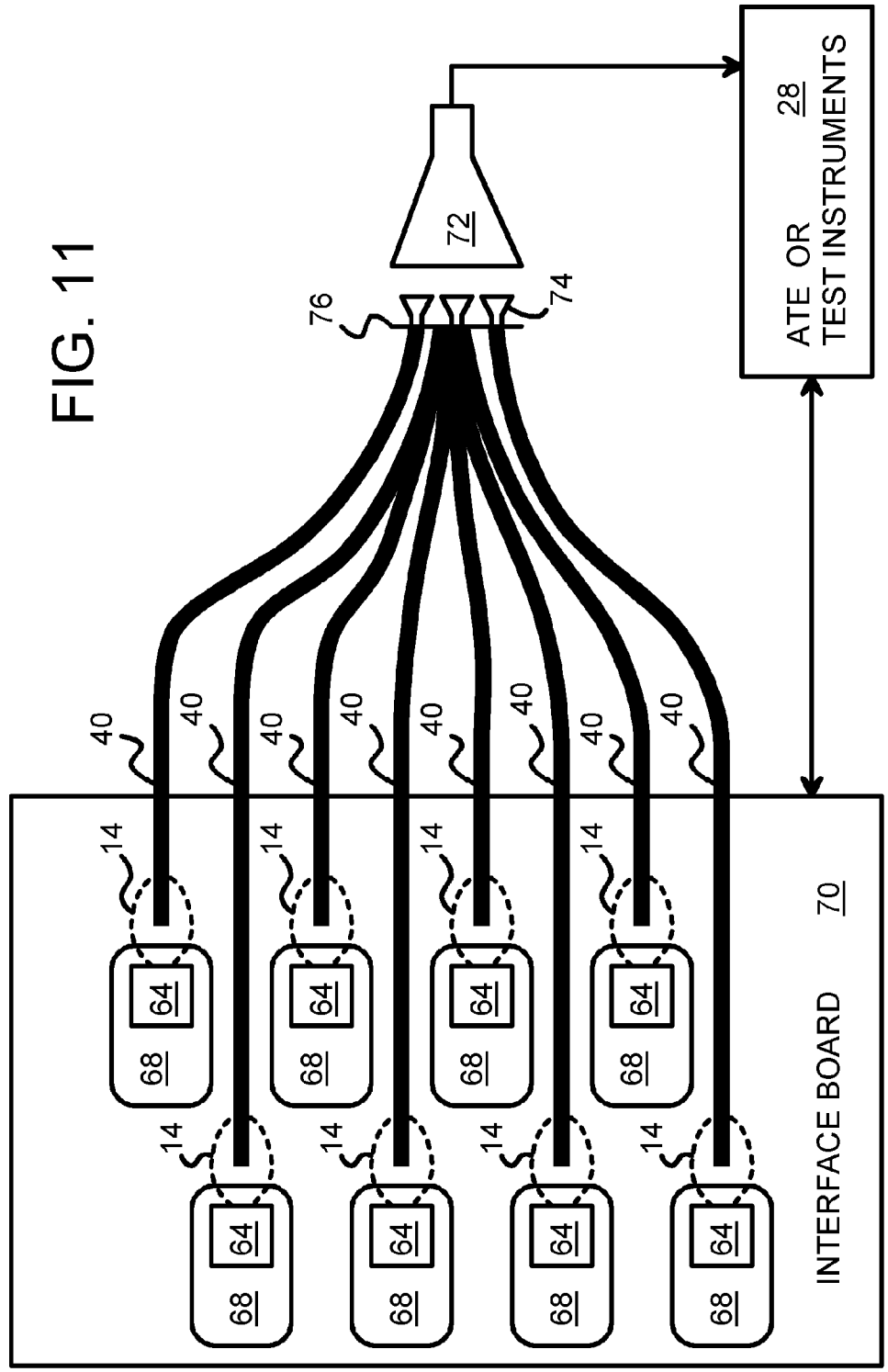

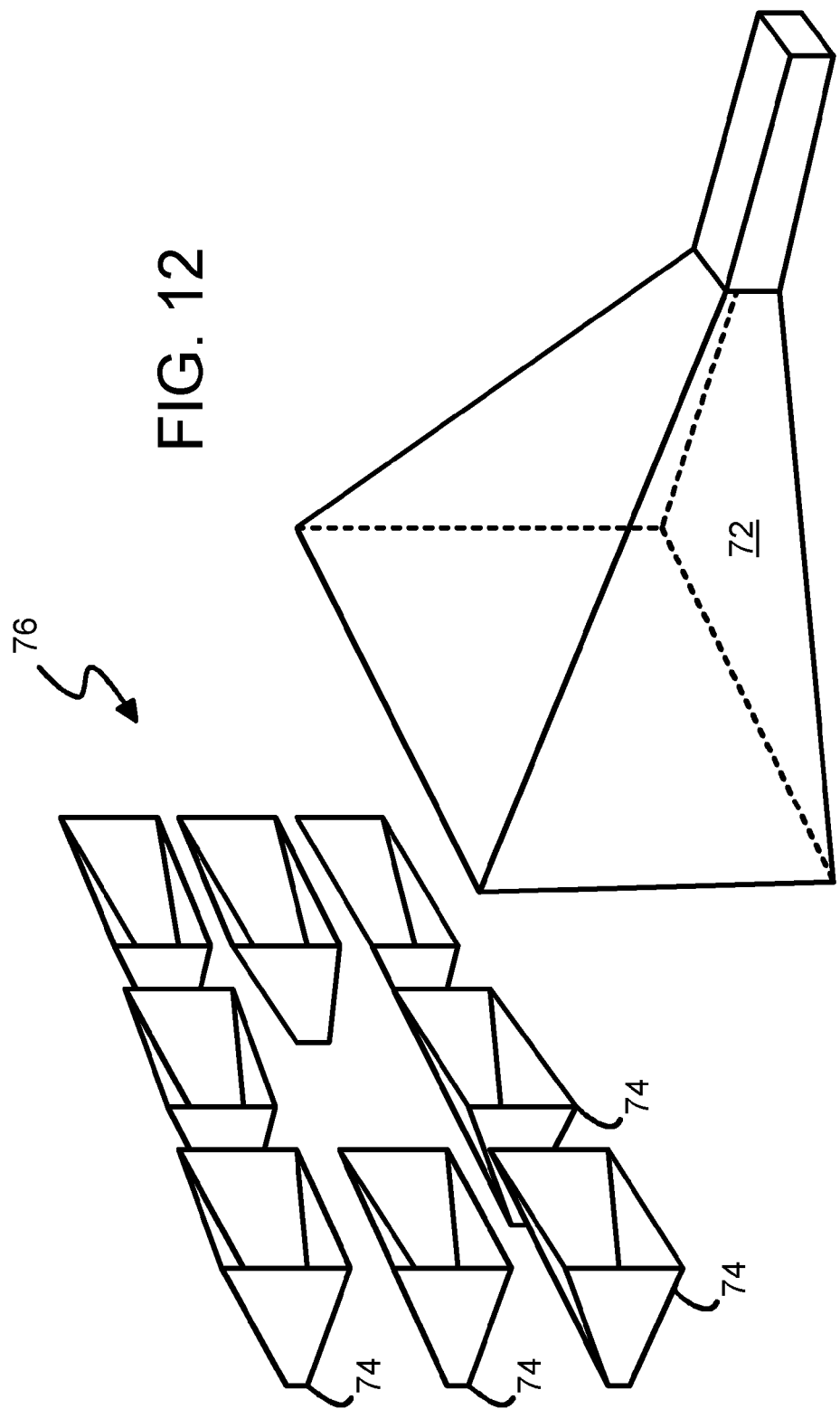

WAVEGUIDES FOR CAPTURING CLOSE-PROXIMITY ELECTROMAGNETIC RADIATION TRANSMITTED BY WIRELESS CHIPS DURING TESTING ON AUTOMATED TEST EQUIPMENT (ATE)

CROSS REFERENCE TO RELATED APPLICATIONS

This application is a continuation of co-pending U.S. application Ser. No. 14/108,708, filed on Dec. 17, 2013, which is incorporated herein by reference in its entirety.

FIELD OF THE INVENTION

This invention relates to test systems, and more particularly to testers that measure electromagnetic radiation emitted by a device.

BACKGROUND OF THE INVENTION

Wireless communication devices typically feature a transmitter chip that drives an antenna. The antenna may be integrated inside the transmitter chip, but more commonly the transmitter chip and the antenna are integrated onto a module or other device.

Various Automated-Test-Equipment (ATE) have been developed to test chips such as transmitter chips. ATE may be connected to a horn antenna to directly measure electromagnetic radiation emitted by the antenna.

FIG. 1 shows a horn antenna connected to an ATE to test for emitted electromagnetic radiation from a transceiver. Interface board 120 connects between ATE 128 and Device-Under-Test (DUT) transceiver 100, which may be placed into a socket (not shown) on interface board 120.

During testing, ATE 128 or other test instruments sends out stimulus or input signals that are routed though interface board 120 to the inputs of DUT transceiver 100. Electrical outputs from DUT transceiver 100 are routed through interface board 120 to ATE 128, which may perform various electrical tests such as for shorts, opens, power-supply current, programming registers, modes, and receiver and other functions. However, a primary function of DUT transceiver 100 is to drive an antenna (not shown) to emit electromagnetic radiation such as Radio-Frequency (RF) waves. The antenna may be part of a module that forms DUT transceiver 100 along with a transceiver integrated circuit (IC).

When ATE 128 activates DUT transceiver 100 to transmit, electromagnetic radiation waves 144 are emitted from the antenna in DUT transceiver 100. These waves 144 travel away from DUT transceiver 100. The radiated signal intensity and the physical geometry of the antenna causes electromagnetic radiation waves 144 to have a pattern that may generally be described as having an envelope 114 where radiation intensities within envelope 114 are above a threshold amount, such as to be detectable by a receiver. Envelope 114 may be a free space envelope around DUT transceiver 100 or may be modified by structures, such as of metal, plastic, or dissipative materials placed near the transceiver.

Horn antenna 102 may be placed within envelope 114 to receive these waves 144. Horn antenna 102 has flaring metal sides shaped like a horn that allow horn antenna 102 to collect electromagnetic radiation. A detector at the rear of the horn receives the electromagnetic radiation that bounces off the flared sides of the horn and into the back of the horn. This detector converts the electromagnetic radiation into electrical signals that are sent to ATE 128 to evaluate the intensity of the electromagnetic radiation transmitted from DUT transceiver 100.

Horn antennas are especially useful for radio waves above 300 MHz. However, they tend to be large in size and bulky. Typically DUT transceiver 100 is much smaller than horn antenna 102. Physically placing a large horn antenna 102 near DUT transceiver 100 is challenging or impossible in many test environments. Thus using a large horn antenna may not be practical.

FIG. 2 shows a radiation chamber in a test environment. Some DUT transceivers 100 may transmit with a very small power. DUT transceiver 104 on interface board 120 transmits with a very low power so that emitted electromagnetic radiation waves 144 form a smaller envelope 116. Due to the small radiated power from the DUT transmitter 104 and the practical sizes of horn antenna 102, horn antenna 102 may not be able to adequately receive the transmitted signal. Radiation chamber 122 helps contain the radiation and direct it to horn antenna 102. Radiation chamber 122 also blocks unwanted noise radiation from reaching horn antenna 102. Noise radiation may arise in an ATE test environment from the high-speed signals sent to interface board 120 or within or surrounding ATE 128.

An opening in radiation chamber 122 is placed over DUT transceiver 104 to receive smaller envelope 116. Electromagnetic radiation waves 144 may bounce off the metal walls of radiation chamber 122 until waves 144 reach horn antenna 102. A detector in the rear of horn antenna 102 converts these electromagnetic radiation waves into electrical signals that are sent to ATE 128 for evaluation.

While radiation chamber 122 may extend the range of horn antenna 102, there are still limits caused by the small radiated power of DUT transceiver 104. The amount of electromagnetic radiation waves 144 that finally reach the detector in the rear of horn antenna 102 may be too low to accurately measure the emitted radiation from DUT transceiver 104. The electromagnetic radiation may be attenuated too much by multiple bounces off of non-ideal walls within radiation chamber 122. Radiation chamber 122 may be too long or too bulky to use in a test environment.

A typical RF receiver that is optimized for communication over distances in the meter to kilometer range is unlikely to be able to accurately receive a signal of very low power when the receiver is not in close proximity (0.1 mm to 20 mm) to the transmitter. The receiver should be optimally placed in close proximity to the low-power transmitter. The optimal placement may be from 0.1 mm to 20 mm. This is a problem since many test fixtures are large and bulky, often much greater than 20 mm in size, preventing a receiver from be placed physically close enough to the DUT transmitter being tested in the test fixture.

Lower frequencies with longer wavelengths have a larger near-field region than do higher frequency signals. Thus radio waves commonly used with Radio-Frequency Identification (RFID) have a near-field region of about a few meters, but the data rates are limited by the radio frequency to perhaps several kHz to a few MHz. Thus RFID systems tend to transmit small amounts of data, such as identifiers.

It is desired to wirelessly transmit video and other data that require high data rates. RFID is too limited by the low frequency of radio waves. The assignee has developed wireless communication systems that use Extremely High-Frequency (EHF) electromagnetic radiation rather than using Radio-Frequency (RF) electromagnetic radiation.

EHF radiation has a frequency in the range of 30 GHz to 300 GHz. This higher frequency allows for data rates as much as 1,000 times faster than with RF transmissions in the MHz range. However, the wavelength of radiation is much smaller than for current RFID systems.

Horn antenna 102 may be too bulky to be placed within 1-2 cm of DUT transceiver 104. Horn antenna 102 may also cause undesirable loading effects on the transmitter and may even shift its transmitted frequency. Thus testing EHF transceivers is problematic. The amount of energy that may be transmitted from an antenna driven by a small IC such as used in DUT transceiver 104 may be so small that a typical receiver would not be able to adequately pick up the transmitted signal at a distance of greater than 20 mm.

What is desired is a test system that collects and detects electromagnetic radiation. A test fixture that is able to direct radiation to and from the DUT to a location outside the test fixture is desired. A test method that can collect small amounts of radiation that are only detectable within a few centimeters of the transmitting antenna is desired. A low-cost method to collect small amounts of radiation emitted from a transmitter is desirable. An EHF near-field radiation collector that can be added to an ATE is also desirable.

BRIEF DESCRIPTION OF THE DRAWINGS

FIG. 6 is a three-dimensional perspective view of a test fixture for testing a DUT transceiver.

FIGS. 8A-B show slots cut in a test fixture to capture downward-directed close-proximity radiation from a DUT transceiver.

FIG. 9 shows a parallel test fixture for capturing close-proximity emissions from a multi-transmitter DUT.

FIG. 10 shows a parallel test fixture for capturing close-proximity emissions from multiple DUT transceivers.

FIG. 11 shows a parallel test fixture for capturing close-proximity emissions from a multiple DUT transceivers and merging captured emissions into an antenna horn.

FIG. 12 shows an array of antenna horns that spatially multiplex captured radiation into a horn antenna.

DETAILED DESCRIPTION

The present invention relates to an improvement in close-proximity testing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a plastic waveguide may be used to capture EHF electromagnetic radiation from within the near field envelope and transport that radiation to a detector or receiver. Plastic material with a high relative permittivity (dielectric constant of 2.0 or greater) and low loss characteristics in the EHF band may be selected so that the waves are carried for a longer distance than through air. Plastic materials such as Low-Density Polyethylene (LDPE) have such characteristics. The walls of the plastic waveguide may be coated with aluminum or other metal, such as by deposition, to reflect the EHF waves back into the plastic material. The plastic may also be surrounded with lower dielectric constant material, such as foam. The plastic material of the waveguide may be flexible, allowing it to act as a cable carrying EHF radiation.

Testing is enabled for transmitters and receivers that are normally in close proximity, such as between 0.1 mm and 2 cm. Close-proximity communication has receiving and transmitting antennas placed between 0.1 mm and 2 cm from each other when transmitting through air. This distance range of 0.1 mm to 2 cm may be modified with external components, such as electromagnetic lens plastics, dissipative materials, and reflective materials.

Figure 1:
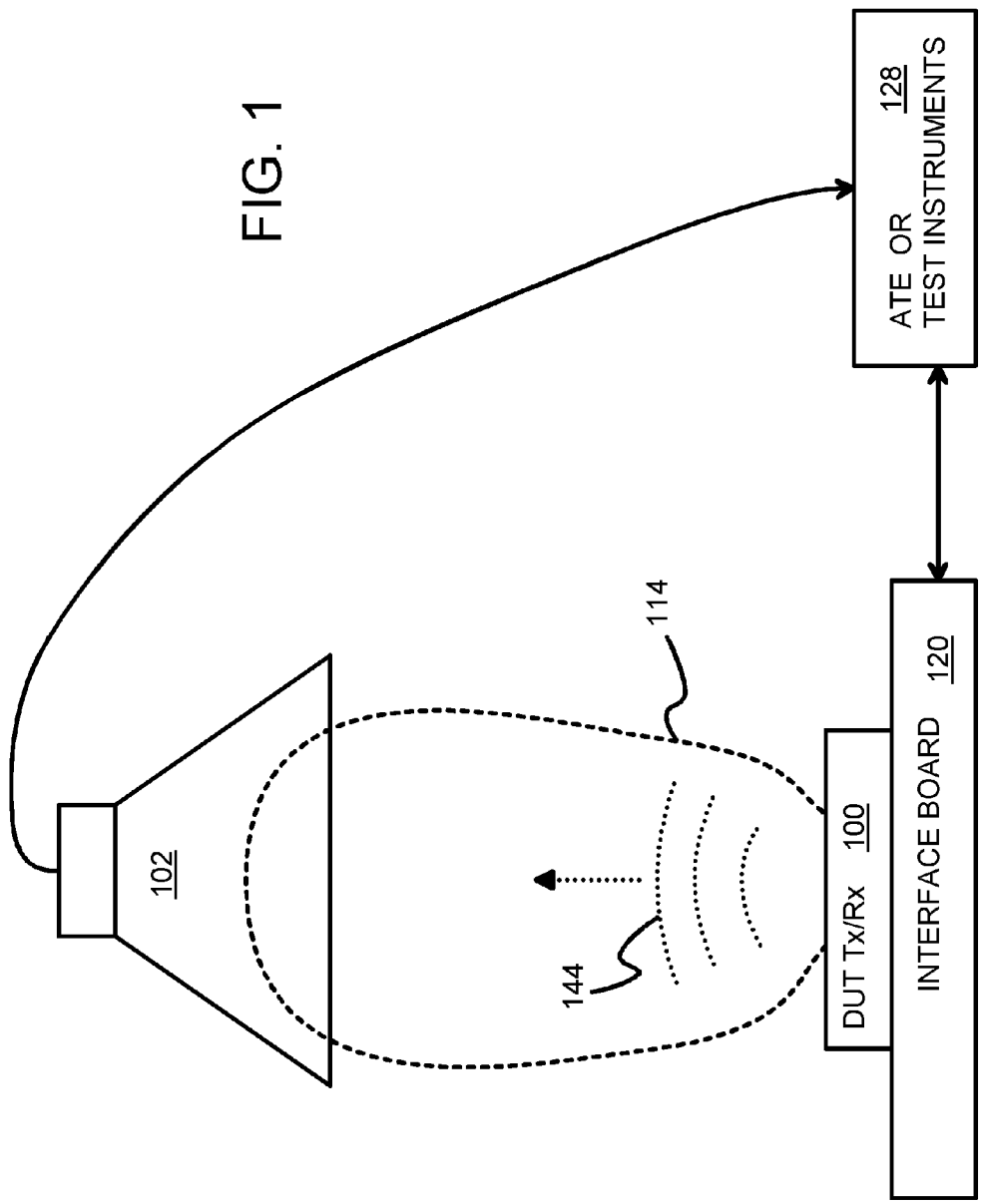
FIG. 1 shows a horn antenna connected to an ATE to test for emitted electromagnetic radiation from a transceiver.
Figure 2:
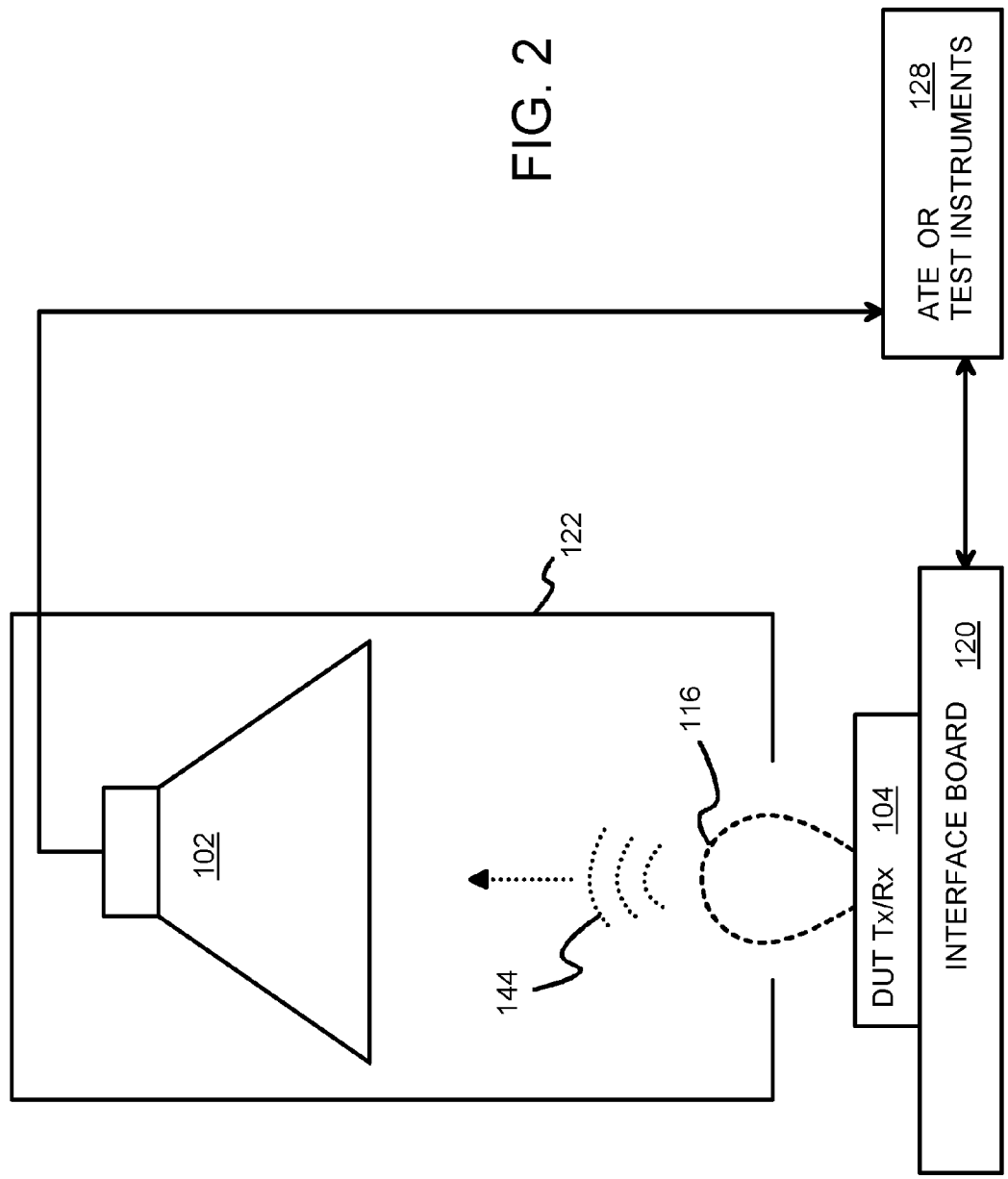
FIG. 2 shows a radiation chamber in a test environment.
Figure 3:
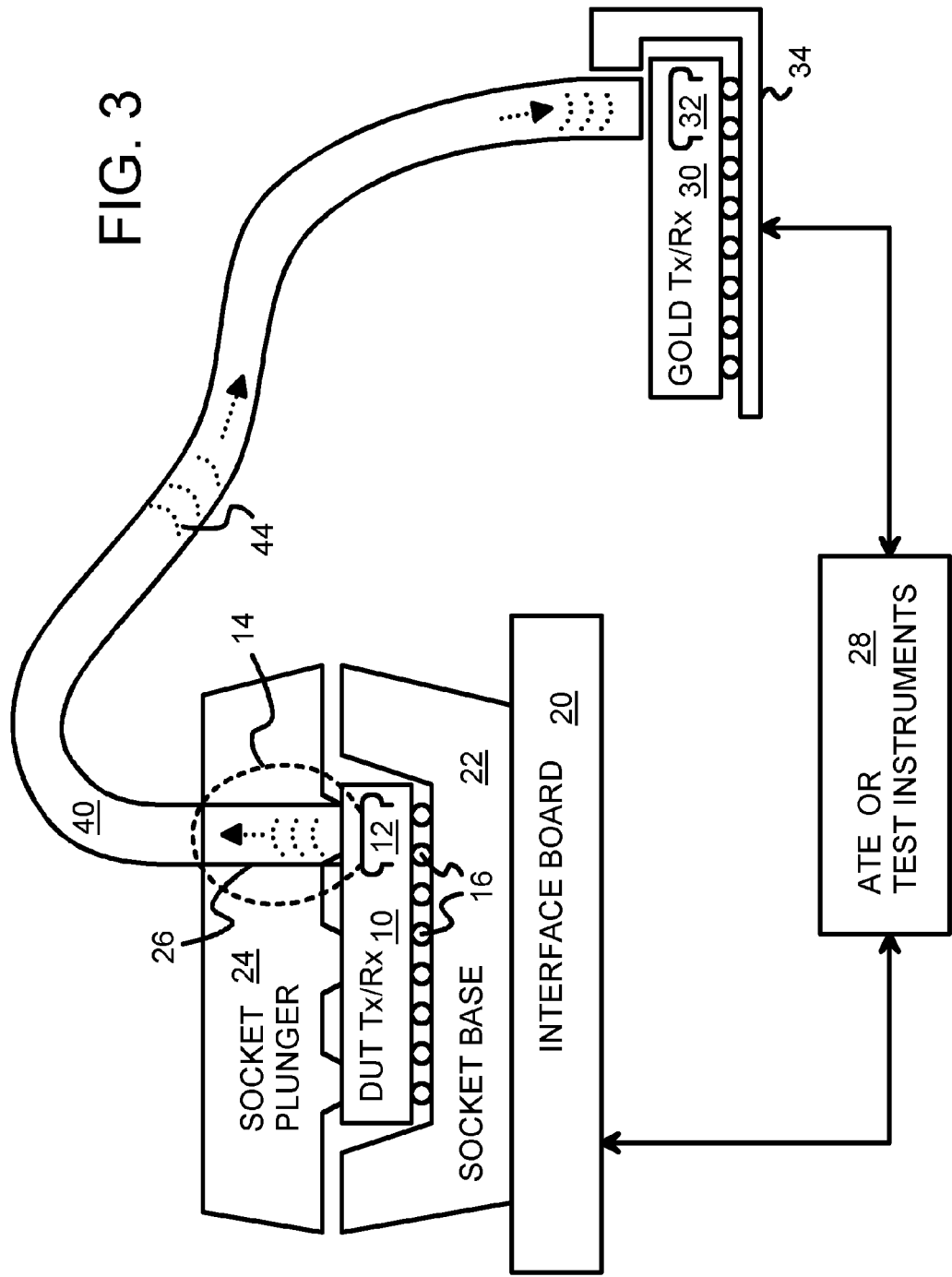
FIG. 3 shows a test system with a plastic waveguide that captures close-proximity electromagnetic radiation emitted from a DUT transceiver.

FIG. 3 shows a test system with a plastic waveguide that captures close-proximity electromagnetic radiation emitted from a DUT transceiver. DUT transceiver 10 includes antenna 12, which is driven with EHF signals and radiates electromagnetic radiation. The radiation may be directional and/or polarized creating envelope 14 of close-proximity radiation from antenna 12. In this example, antenna 12 directs emissions upward into the plastic waveguide.

Socket plunger 24 presses down on DUT transceiver 10 to keep DUT transceiver 10 pressed into socket base 22 so that contact pins 16 on DUT transceiver 10 mate with contact pins on socket base 22. Electrical signals generated by ATE 28 or another test equipment or test controller drive DUT transceiver 10 through interface board 20 and contact pins 16. When activated, DUT transceiver 10 generates electrical signals in the EHF band that are passed through antenna 12 to generate EHF electromagnetic radiation. Socket plunger 24 or socket base 22 may block, attenuate, direct, or alter the electromagnetic radiation generated by DUT transceiver 10. Radiation may be blocked by or directed around metal parts such as clamps, springs, and screws in socket plunger 24 or socket base 22.

Slot 26 is cut, drilled, or otherwise formed in socket plunger 24 with dimensions so that one end of plastic waveguide 40 may be inserted into slot 26. Ideally, slot 26 is directly above and aligned with antenna 12 in DUT transceiver 10 so that the end of plastic waveguide 40 inserted into slot 26 is within envelope 14 and facing antenna 12. Since the close-proximity emissions are mostly within envelope 14, some of these close-proximity emissions are captured by the end of plastic waveguide 40. EHF electromagnetic radiation waves 44 travel through plastic waveguide 40. Plastic waveguide 40 may be flexible so that it may bend, allowing the EHF electromagnetic radiation waves to be directed wherever plastic waveguide 40 is placed. The metalized walls of plastic waveguide 40 contain the electromagnetic radiation within plastic waveguide 40, although some signal degradation may occur.

Since the relative permittivity (Er) of the plastic material in plastic waveguide 40 is higher than that of air, the electromagnetic radiation is more concentrated along plastic waveguide 40. The concentrated radiation is guided by the plastic waveguide, allowing radiation to travel a greater distance along plastic waveguide 40 than through the air. For example, a plastic material with a relative permittivity of 4 may be selected for plastic waveguide 40, so that the EHF radiation will be more concentrated. Metalized walls of plastic waveguide 40 contain the concentrated radiation allowing it to travel greater distances.

The length of plastic waveguide 40 may be up to several meters, compared with close-proximity envelope 14 which may be only 2 cm. Thus plastic waveguide 40 allows the close-proximity electromagnetic radiation to be carried much farther than the close-proximity envelope. This result allows the radiation detector to be placed relatively far away from DUT transceiver 10, socket base 22, and socket plunger 24, which may be relatively large and bulky.

The other end of plastic waveguide 40 is directed onto receiver antenna 32 within known-good transceiver 30. Known-good transceiver 30 may be a "gold" example of DUT transceiver 10 that has passed testing and is known to be functional, or "good". Interface board 34 connects known-good transceiver 30 to ATE 28. When electromagnetic radiation waves 44 travel along plastic waveguide 40 and are directed onto receiver antenna 32, electromagnetic signals are detected on receiver antenna 32 which are detected, amplified, and output by known-good transceiver 30 to ATE 28. ATE 28 may compare these output signals from known-good transceiver 30 to an expected data pattern, or to the data pattern that DUT transceiver 10 was instructed to transmit. A data mismatch may indicate that DUT transceiver 10 is faulty, while matching data from known-good transceiver 30 indicates that DUT transceiver 10 is good.

The end of plastic waveguide 40 may be held in place over receiver antenna 32 by a clamp, slot, or other fixture. During testing of a batch of DUT transceivers 10, known-good transceiver 30 is not replaced, but DUT transceiver 10 is replaced after each test procedure, with the tested DUT transceiver 10 being sorted into either a good bin or into a bad bin.

Figure 4:
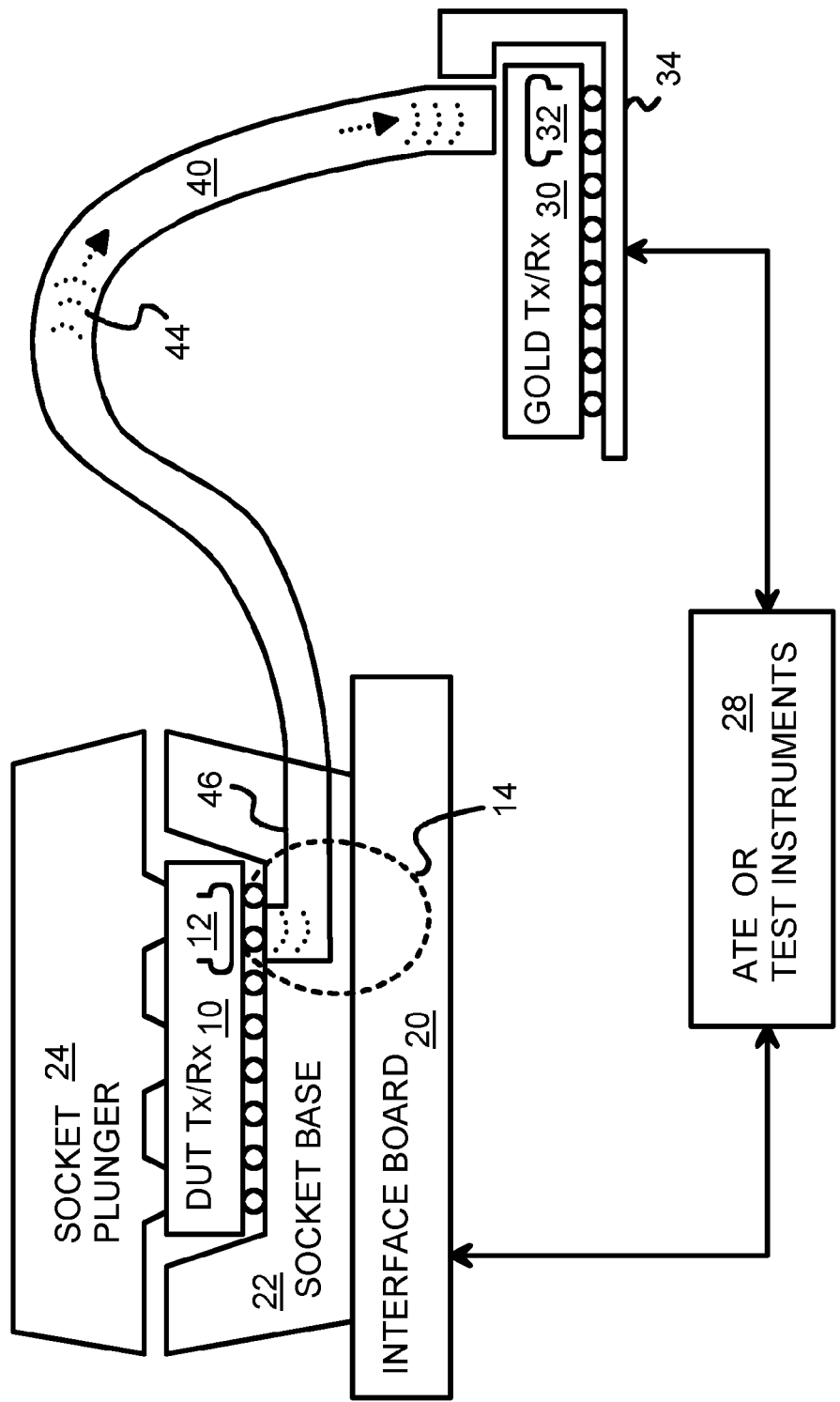
FIG. 4 shows a test system with a plastic waveguide that captures close-proximity electromagnetic radiation emitted downward from a DUT transceiver.

FIG. 4 shows a test system with a plastic waveguide that captures close-proximity electromagnetic radiation emitted downward from a DUT transceiver. DUT transceiver 10 includes antenna 12, which is driven with EHF signals and radiates electromagnetic radiation. The radiation may be directional and/or polarized creating envelope 14 of close-proximity radiation from antenna 12. In this example, antenna 12 directs emissions downward rather than upward as in the example of FIG. 3.

Slot 46 is formed in socket base 22 rather than in socket plunger 24, since envelope 14 is directed downward from DUT transceiver 10 in the example of FIG. 4. The electromagnetic radiation emitted from antenna 12 may pass around contact pins 16 and into the end of plastic waveguide 40.

Although plastic waveguide 40 may be flexible, it may not be able to make a 90-degree bend as does slot 46. Plastic waveguide 40 may be forced into the horizontal part of slot 46 until its end reaches the vertical part of slot 46 under DUT transceiver 10. The end of plastic waveguide 40 inserted into slot 46 may not be metalized, or have its metalization removed, so that electromagnetic radiation from antenna 12 that is emitted into the vertical portion of slot 46 may enter plastic waveguide 40. The captured radiation follows regions of higher relative dielectric constant, such as the plastic in plastic waveguide 40, and reflects off conductive surfaces, such as the outer walls of a metalized plastic waveguide 40.

The vertical and horizontal portions of slot 46 may join with a bevel that is metalized so that radiation moving vertically downward from antenna 12 is reflected by 90-degrees into the horizontal slot 46 and into plastic waveguide 40. In some applications, the radiation is able to follow the bend between the horizontal and vertical portions without using a beveled corner.

The collected radiation from plastic waveguide 40 is directed onto receiver antenna 32 of known-good transceiver 30. ATE 28 then compares the received data from known-good transceiver 30 to the data transmitted by DUT transceiver 10.

Figure 5:
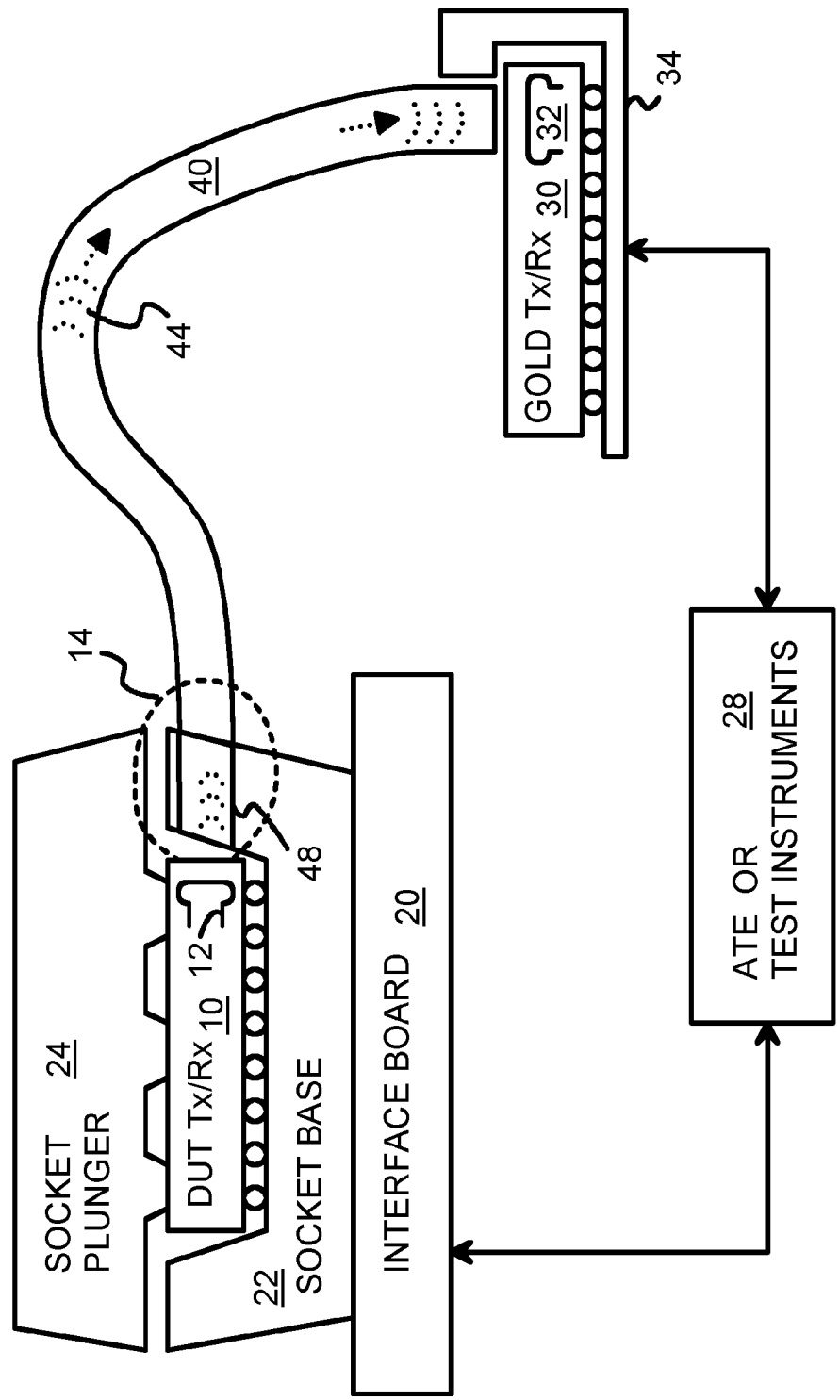
FIG. 5 shows a test system with a plastic waveguide that captures close-proximity electromagnetic radiation emitted sideways from a DUT transceiver.

FIG. 5 shows a test system with a plastic waveguide that captures close-proximity electromagnetic radiation emitted sideways from a DUT transceiver. DUT transceiver 10 includes antenna 12 driven with EHF signals. In this example, antenna 12 directs emissions horizontally out the side of DUT transceiver 10 rather than upward as in the example of FIG. 3.

Slot 48 is cut or formed on the side of socket base 22, such as by drilling a hole in socket base 22. Electromagnetic radiation is emitted by antenna 12 out the side of DUT transceiver 10, causing envelope 14 to have a generally horizontal rather than a vertical orientation. Then end of plastic waveguide 40 inserted into slot 48 is within envelope 14 and thus captures the close-proximity radiation emitted from side-directed antenna 12. Once captured, electromagnetic radiation waves 44 travel along plastic waveguide 40 until directed onto receiver antenna 32 in known-good transceiver 30.

FIG. 6 is a three-dimensional perspective view of a test fixture for testing a DUT transceiver. Socket plunger 24 is able to open and close, such as by being raised and lowered, or by pivoting about a hinge, to allow access to DUT cavity 90. DUT transceiver 10 (not shown) is placed into DUT cavity 90 when socket plunger 24 is open. Then socket plunger 24 is lowered onto socket base 22 to press DUT transceiver 10 into DUT cavity 90 so that contact pins 16 mate with contact pads inside DUT cavity 90. Once testing is completed, socket plunger 24 is again opened, allowing DUT transceiver 10 to be removed and another DUT transceiver 10 placed into DUT cavity 90 for testing.

Figure 7A:
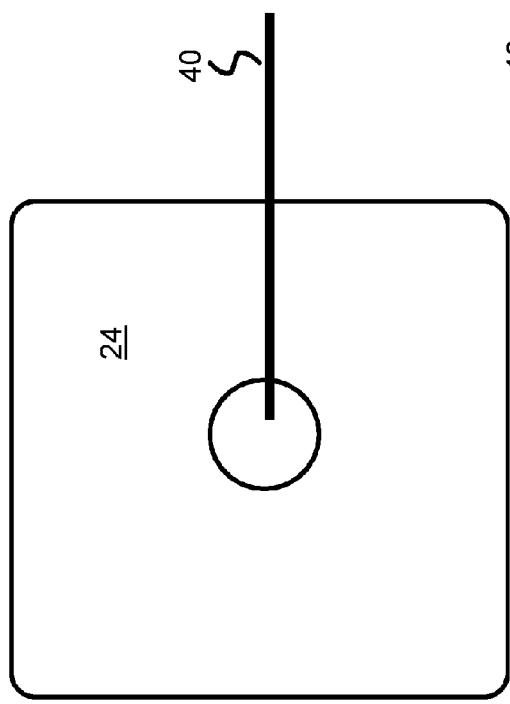
FIGS. 7A-B show slots cut in a test fixture to capture upward-directed close-proximity radiation from a DUT transceiver.
Figure 7B:
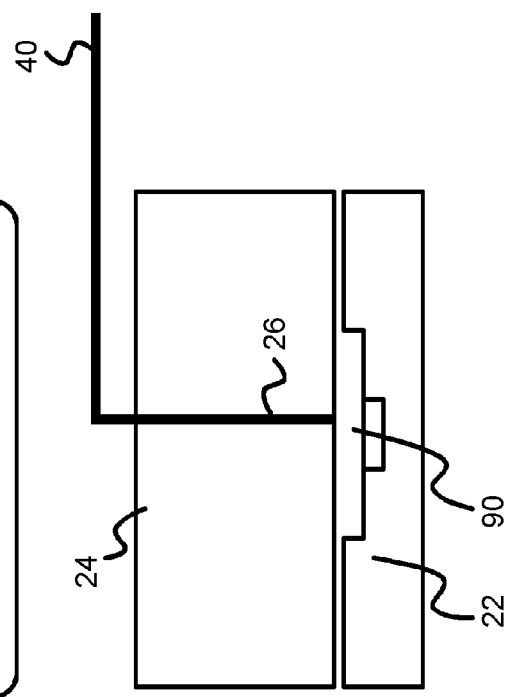

FIGS. 7A-B show slots cut in a test fixture to capture upward-directed close-proximity radiation from a DUT transceiver. In FIG. 7A, one end of plastic waveguide 40 is inserted into slot 26 of socket plunger 24. In FIG. 7B, plastic waveguide 40 in slot 26 collects electromagnetic radiation from a DUT transceiver 10 (not shown) in DUT cavity 90 between socket plunger 24 and socket base 22.

FIGS. 8A-B show slots cut in a test fixture to capture downward-directed close-proximity radiation from a DUT transceiver. In FIG. 8A, one end of plastic waveguide 40 is inserted into slot 46 of socket base 22. In FIG. 8B, plastic waveguide 40 in slot 46 collects electromagnetic radiation from a DUT transceiver 10 (not shown) in DUT cavity 90 between socket plunger 24 and socket base 22.

FIG. 9 shows a parallel test fixture for capturing close-proximity emissions from a multi-transmitter DUT. Multi-transmitter DUT 62 contains four transceivers 60, each with an antenna (not shown) that generate envelopes 14 of close-proximity EHF electromagnetic radiation. Interface board 20 drives electrical signals from ATE 28 to multi-transmitter DUT 62 to activate the four transceivers 60 to emit radiation.

Four plastic waveguides 40 are provided, each with an end inside an envelope 14 created by one of the four transceivers 60. The other ends of the four plastic waveguides 40 are merged together by adapter 66. Adapter 66 may be a WR-15 waveguide-to-coax converter or other similar converter, which converts electromagnetic radiation waves into electrical signals that are applied to ATE 28. The four plastic waveguides 40 may be merged together by adapter 66 or before input to adapter 66. One of the four transceivers 60 may be activated by ATE 28 at a time, with the collected radiation merged and evaluated by adapter 66. ATE 28 may be a 60-GHz capable coax ATE or a waveguide-based transmit-receive test system.

FIG. 10 shows a parallel test fixture for capturing close-proximity emissions from multiple DUT transceivers. Interface board 70 contains eight test sockets 68 that may each hold a DUT transceiver 64 for testing by signals from ATE 28. Each DUT transceiver 64 has an antenna (not shown) that generate envelopes 14 of close-proximity EHF electromagnetic radiation. Interface board 70 drives electrical signals from ATE 28 to DUT transceivers 64 to activate the transceivers to emit radiation.

Eight plastic waveguides 40 are provided, each with an end inside an envelope 14 created by one of the eight DUT transceivers 64. The other ends of the eight plastic waveguides 40 are merged together by adapter 66 or before adapter 66. Adapter 66 may be a WR-15 waveguide-to-coax converter, or other similar converter, which converts electromagnetic radiation waves into electrical signals that are applied to ATE 28.

One of the eight DUT transceivers 64 is activated by ATE 28 at a time, with the collected radiation merged and evaluated by adapter 66. ATE 28 may be a 60-GHz capable coax ATE or a waveguide-based transmit-receive test system.

FIG. 11 shows a parallel test fixture for capturing close-proximity emissions from a multiple DUT transceivers and merging captured emissions into an antenna horn. Interface board 70 contains eight test sockets 68 that may each hold a DUT transceiver 64 for testing by signals from ATE 28. Each DUT transceiver 64 has an antenna (not shown) that generate envelopes 14 of close-proximity EHF electromagnetic radiation. Interface board 70 drives electrical signals from ATE 28 to DUT transceivers 64 to activate the transceivers to emit radiation.

Eight plastic waveguides 40 are provided, each with an end inside an envelope 14 created by one of the eight DUT transceivers 64. The other ends of the eight plastic waveguides 40 are each applied to antenna horn 74 in an array of horns 76. Each antenna horn 74 receives the captured radiation from plastic waveguide 40 at the small end of the horn, and emits the captured radiation in the flared or larger end of antenna horn 74. The emitted radiation from the eight antenna horns 74 are collected by horn antenna 72, which has its flared opening facing the flared openings of antenna horns 74. Thus radiation is spatially multiplexed by the eight antenna horn 74 that face the opening of horn antenna 72.

One of the eight DUT transceivers 64 is activated by ATE 28 at a time, with the collected radiation merged and evaluated by horn antenna 72. A waveguide-to-coax adapter (not shown) may be placed after horn antenna 72 to provide an electrical signal to ATE 28. ATE 28 may be a 60-GHz capable coax ATE or a waveguide-based transmit-receive test system.

FIG. 12 shows an array of antenna horns that spatially multiplex captured radiation into a horn antenna. Antenna horns 74 may have metalized outer surfaces over shapes formed by a multi-layer printed-circuit board (PCB) process. The rear of each antenna horn 74 is connected to the end of plastic waveguide 40 that is farthest from DUT transceivers 64. The collected radiation from plastic waveguide 40 is emitted by antenna horn 74 into the large open mouth of horn antenna 72. Thus radiation from eight plastic waveguides 40 are merged by horn antenna 72.

Figure 13A:
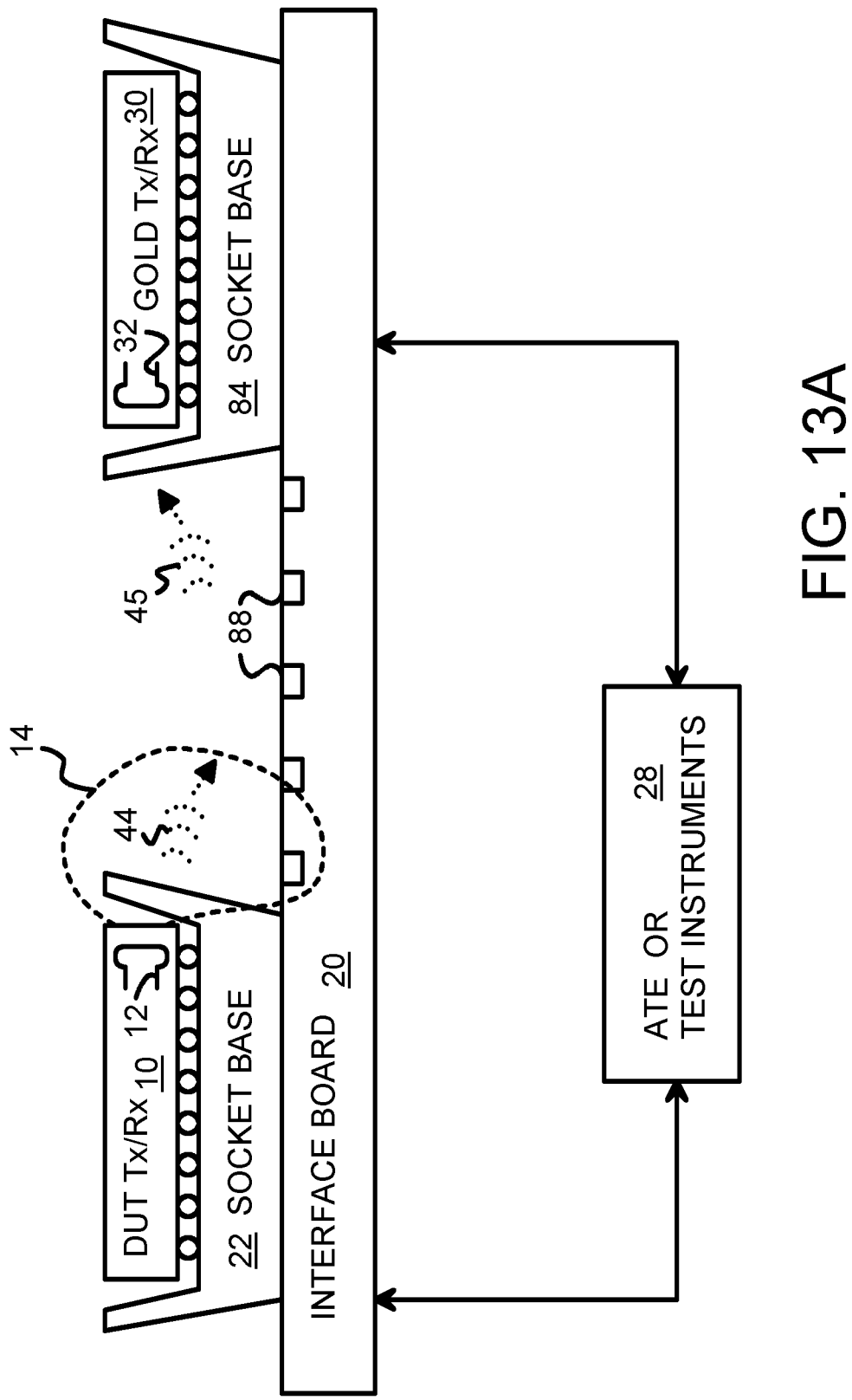
FIGS. 13A-B show periodic close-proximity directors in a test fixture.
Figure 13B:
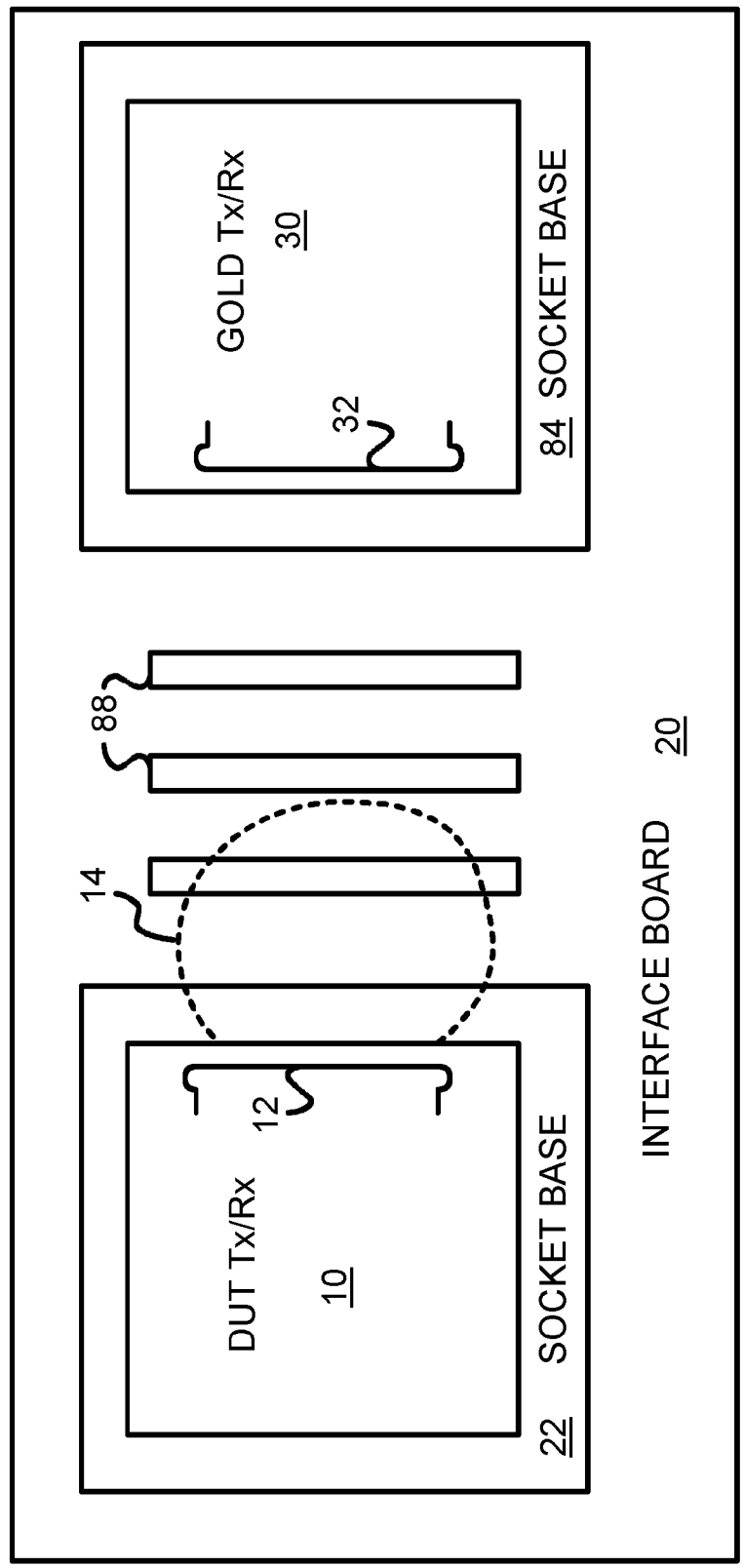

FIGS. 13A-B show periodic close-proximity directors in a test fixture. Metallic micro-strips 88 are formed on or near the surface of interface board 20. These metallic micro-strips 88 act as Yagi directors.

Metallic micro-strips 88 are placed parallel to each other and with a spacing of a fraction of a wavelength of the carrier wave of electromagnetic radiation waves 44 emitted from antenna 12 in DUT transceiver 10. For 60 GHz, metallic micro-strips 88 may have a spacing of 1.25 mm. There may be many more metallic micro-strips 88 than shown in FIG. 13A-B.

No slot is needed in socket base 22. Envelope 14 reaches the first of the metallic micro-strips 88, which then carry the emitted electromagnetic waves 44 along the array of metallic micro-strips 88. Reflected electromagnetic waves 45 are then sent from the last of metallic micro-strips 88 to receive antenna 32 in known-good transceiver 30, which is held in socket 84 on interface board 20. ATE 28 may connect to both DUT transceiver 10 and to known-good transceiver 30 through interface board 20.

Metallic micro-strips 88 are perpendicular to the propagation direction of electromagnetic radiation waves 44. Waves 44 may travel a distance greater than the 1-2 cm of envelope 14. The function of plastic waveguide 40 is performed by metallic micro-strips 88, so plastic waveguide 40 is not needed in this embodiment.

Alternate Embodiments

Several other embodiments are contemplated by the inventors. For example DUT transceiver 10 may have an antenna integrated onto the same silicon or Gallium-Arsenide or other semiconductor substrate as the transceiver circuit, or an antenna that is otherwise located inside or outside the same package as the transceiver circuit. More than one transceiver may be integrated onto the same semiconductor substrate. The antenna could have a metal reflector near it to direct the electromagnetic radiation in a certain direction, such as upward or horizontally. The terms upward, downward, horizontal, vertical, etc. are relative terms and may change with or depend on the viewer's reference frame.

While a DUT transceiver has been described, the DUT may be a transmitter without a receiver, or may be a transceiver with the receive function disabled, either permanently or temporarily. Likewise, the known good receiver may be a transceiver that has its transmitter disabled. In the examples of FIGS. 3-5, known-good transceiver 30 is shown with a top-directed receiver antenna 32, which does not match the antenna direction of DUT transceivers 10 in FIG. 4, 5. A bottom or side antenna may be substituted for receiver antenna 32 in known-good transceiver 30 in the examples of FIGS. 5, 6 when testing those kinds of devices, or a non-matching known-good transceiver 30 may be used as shown. A different kind of radiation detector may replace known-good transceiver 30; the detector does not have to be exactly the same kind of device as DUT transceiver 10, although this may be desirable for ease of test-program development.

While contact pins 16 have been described for DUT transceiver 10, other interconnects may be used, such as pins, mating pads, balls, or edge connectors, which may be arranged in grids, lines, a perimeter, or other arrangements. Socket plunger 24 may use springs, clips, clamps, or other components to clamp DUT transceiver 10 to socket base 22. Socket plunger 24 may be part of a robotic system. DUT transceiver 10 may be placed into position when socket plunger 24 is open, then socket plunger 24 is closed for testing. A robotic arm may move, place, insert, and remove DUT transceiver 10. Many physical configurations of socket base 22 and socket plunger 24 are possible. Multiple DUT transceivers 10 may be placed into a multi-socket fixture for parallel testing.

Some embodiments may delete socket plunger 24. Instead, a robotic arm may place DUT transceiver 10 into DUT cavity 90, and socket base 22 may have its own clamp, lever, or other component to lock DUT transceiver 10 into place for testing, without the need for socket plunger 24 to press down on DUT transceiver 10. The function of socket plunger 24 to hold DUT transceiver 10 in place may thus be accomplished by socket base 22, and socket base 22 may be thought of as integrating both socket base 22 and socket plunger 24 into the same socket fixture.

High-temperature testing could be supported by adding a heating element to socket plunger 24 or to socket base 22. A blast of cold or hot air could be blown onto the test fixture, or the entire test fixture could be placed in a temperature-controlled chamber.

Slots 26, 46, and 48 may have a variety of shapes and sizes. A plastic or other material may fill slots 26, 46, and 48 rather than have plastic waveguide 40 pressed fully into these slots. An internal plastic waveguide could be constructed within socket base 22 or socket plunger 24 that then couples to and external plastic waveguide 40. EHF reflective material may be placed on the walls of slots 26, 46, and 48 to enhance the wave-guiding properties. Alternately, cuts or holes may be drilled into socket base 22 or socket plunger 24 to allow a flexible plastic waveguide 40 to be inserted into envelope 14.

The slot may be a hole with a round cross-section, a rectangular hole with a rectangular cross-section, a triangular, hexagonal, or other hole with a triangular, hexagonal, or other cross-section such as any polygon or shape. The slot may be a cut made with a saw or other cutting device, or may be formed during manufacture of the test socket. An existing opening in the test socket may be used for the slot. When the test socket does not completely cover DUT transceiver 10, and the antenna directs radiation into the non-covered part of the test socket, plastic waveguide 40 may be clamped, glued, or otherwise held in place above antenna 12 without cutting a slot into the test socket since the uncovered part of the test socket acts as a pre-existing access port or slot.

Plastic waveguide 40 may be a solid flexible cable of plastic that has a high relative permittivity (dielectric constant) and a low loss tangent. Plastic materials are generally of low cost, reducing the cost of the test apparatus compared with horn antennas. The length and cross-section of this cable may be tuned to the frequency of the electromagnetic radiation, such as 60 GHz. While a plastic waveguide 40 of solid plastic material has been described, a small cavity filled with air or other material may be used. Plastic waveguide 40 may be made entirely from the same plastic material, or could have regions of different plastic or other materials. Discontinuities of materials could be strategically introduced for various purposes, such as to reflect, deflect, or split electromagnetic radiation. While metalized walls of plastic waveguide 40 have been described, non-metalized walls or simply the surface of the plastic may still reflect enough electromagnetic energy to be useful.

The shapes and orientation of close-proximity radiation envelopes 14 as shown are simplified. Real radiation patterns may have variations in intensities, nodes, relative maxima and minima, may bend around objects or through objects such as parts of socket base 22 or socket plunger 24, and may spread out or narrow in unusual ways. Actual envelopes 14 may be asymmetric and have odd shapes. Envelope 14 may be simulated or measured with various instruments.

As an alternative to FIGS. 9-11, a known-good transceiver 30 (FIG. 3) may be placed after the multiple plastic waveguides 40 are merged together, rather than use adapter 66. Four or eight known-good transceivers 30 could also be used if plastic waveguides 40 are not merged together. Some other number of DUT transceivers 64 may be tested by interface board 70. Multi-transmitter DUT 62 may contain a different number of transceivers, such as 8, 2, 16, etc.

Metallic micro-strips 88 could be combined with slot 26, 46, or 48, or with plastic waveguide 40. For example, slot 46 could direct more electromagnetic radiation onto metallic micro-strips 88. Metallic micro-strips 88 could end at the first end of plastic waveguide 40, which then carries the electromagnetic radiation waves the remaining distance to the receiver. Antenna horns 74 may be produced by a variety of methods such as by a printing process and may be separated or integrated onto a single substrate.

While testing of the transmit function of DUT transceiver 10 has been described, the receive function could also be tested while DUT transceiver 10 is still in socket base 22. A much larger in size and more powerful transmitter may be used that is activated by ATE 28, and has a much larger close-proximity envelope that can penetrate socket plunger 24. Alternately, a second test fixture could be created that uses a known-good device for the transmitter into plastic waveguide 40, and the DUT placed on interface board 34 in place of known-good transceiver 30. Alternately, known-good transceiver 30 could be set to transmit, and DUT transceiver 10 set to receive, with electromagnetic radiation waves 44 traveling in a reverse direction in plastic waveguide 40.

Many wireless connection applications require a very small form factor, such as for a smart phone or tablet wirelessly connecting to a dock. DUT transceiver 10 may need to be less than 1 cm per side, while Multi-transmitter DUT 62 may need to be less than 5 cm on its longest dimension. Some applications may require that DUT transceiver 10 be only 0.5 cm in the longest dimension. This small size for the transceiver and antenna severely limits the amount of power that may be radiated as electromagnetic radiation. Envelope 14 is thus very small in size, such as less than 2 cm before near-field effects die out.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A test system for testing a Device-Under-Test (DUT) that emits close-proximity electromagnetic radiation, the test system comprising:
    a test socket that holds the DUT during testing;
    an interface board electrically connected between a test controller and electrical contacts of the DUT, when the DUT is held in the test socket;
    an opening formed in the test socket, the opening extending into a first envelope of electromagnetic radiation, the first envelope created during testing by a first DUT antenna included in the DUT;
    a first waveguide being placed to receive electromagnetic radiation emitted by the first DUT antenna during testing; and
    a first receiver antenna placed near a second end of the first waveguide, wherein the electromagnetic radiation emitted by the first DUT antenna during testing is carried by the first waveguide to the second end and directed onto the first receiver antenna, the second end disposed outside of the first envelope.

2. The test system of claim 1, wherein the first waveguide comprises regions of plastic and non-plastic materials.

3. The test system of claim 1, wherein the DUT comprises a plurality of transceiver integrated circuits (ICs) with multiple antennas, wherein each antenna generates an envelope for one of the plurality of transceiver ICs; and
    the test system further comprises a plurality of waveguides, each waveguide having a first end situated in the envelope of a different one of the multiple antennas of the DUT.

4. The test system of claim 3, further comprising:
    an adapter receiving second ends of the plurality of waveguides, the adapter merging electromagnetic radiation carried by the plurality of waveguides for reception by the first receiver and at least one additional receiver.

5. The test system of claim 1, wherein the first envelope is less than 2 centimeters in its longest dimension;
    wherein the DUT has a longest dimension that is less than 5 centimeters;
    wherein the first DUT antenna has a longest dimension that is less than 1 centimeter.

6. The test system of claim 1, wherein the DUT operates in an Extremely High-Frequency (EHF) band of 30 GHz to 300 GHz;
    wherein the electromagnetic radiation emitted from the DUT is EHF radiation having a frequency between 30 GHz and 300 GHz,
    wherein the DUT is an EHF transmitter.

7. The test system of claim 1, wherein the DUT is a module containing an EHF transceiver integrated circuit (IC) and the first DUT antenna.

8. The test system of claim 1, wherein the DUT is an integrated circuit IC containing an EHF transceiver circuit integrated onto a same semiconductor substrate with the first DUT antenna.

9. The test system of claim 1, wherein the opening is a slot cut into the test socket, the slot sized to receive the first waveguide, and wherein the first end of the first waveguide is placed within the first envelope.

10. The test system of claim 9, wherein the first DUT antenna radiates in an upward direction, wherein the first envelope is above the DUT;
    wherein the first end of the first waveguide is placed above the first DUT antenna and facing the DUT to receive the electromagnetic radiation emitted by the first DUT antenna during testing.

11. The test system of claim 9, wherein the test socket further comprises:
    a socket base connected to the interface board;
    a DUT cavity in the socket base for receiving the DUT during testing;
    a socket plunger situated above the socket base, the socket plunger pressing the DUT into the DUT cavity during testing;
    wherein the opening is formed in the socket plunger, and when the first DUT antenna radiates in an upward direction, the first envelope extends into the socket plunger;
    wherein the opening is formed in the socket base, and when the first DUT antenna radiates in a downward direction, the first envelope extends into the socket base.

12. The test system of claim 11, wherein the opening is formed horizontally in a side of the socket base, and when the first DUT antenna radiates in a horizontal direction, the first envelope extends into the side of the socket base.

13. The test system of claim 1, further comprising:
    a transceiver;
    wherein the first receiver antenna is in the transceiver;
    wherein the first waveguide directs the electromagnetic radiation emitted by the first DUT antenna into the first receiver antenna in the transceiver;
    wherein the test controller compares data received by the transceiver with a predetermined data pattern, the test controller indicating that the DUT is faulty when the received data and the predetermined data pattern mismatch.

14. The test system of claim 13, wherein the transceiver comprises a known-good transceiver being of a device type intended to be paired with the DUT in an end-user system.

15. A test system for testing a Device-Under-Test (DUT) that emits close-proximity electromagnetic radiation, the test system comprising:
- a test socket that holds the DUT during testing;
- an opening formed in the test socket, the opening extending into a first envelope of electromagnetic radiation, the first envelope created during testing by a first DUT antenna included in the DUT;
- a first waveguide being placed to receive electromagnetic radiation emitted by the first DUT antenna during testing; and
- a first receiver antenna placed near a second end of the first waveguide, wherein the electromagnetic radiation emitted by the first DUT antenna during testing is carried by the first waveguide to the second end and directed onto the first receiver antenna, the second end disposed outside of the first envelope.

16. The test system of claim 15, wherein the DUT comprises:
- a plurality of transmitters devices configured to generate encoded data on a carrier wave of at least 30 GHz; and
- a plurality of antennas, each of the plurality of antennas configured to generate a corresponding envelope of electromagnetic radiation; and
- the test system further comprises a plurality of waveguides, each waveguide having a first end situated within an envelope generated by a different one of the plurality of antennas of the DUT, and a second end not within the envelope generated by a different one of the plurality of antennas, wherein electromagnetic radiation captured at the first end is carried through each of the plurality of waveguides to the second end.

17. The test system of claim 16, wherein the plurality of transmitter devices are integrated together onto a multi-transmitter module, wherein the multi-transmitter module is inserted into the test socket.

18. The test system of claim 16, further comprising:
- a plurality of additional test sockets for holding devices during testing;
- wherein the plurality of transmitter devices are each inserted into a different one of the plurality of test sockets.

19. The test system of claim 16, further comprising:
- a tester that compares data re-generated from the electromagnetic radiation at the second end of each of the plurality the waveguides to expected data transmitted by the corresponding transmitter device and signals a faulty transmitter device when the data re-generated mismatches the expected data.

20. The test system of claim 19, further comprising:
- a plurality of antenna horns, each antenna horn having a waveguide end that receives electromagnetic radiation from one of the plurality of waveguides, and a flared end that is larger in cross-sectional area than the waveguide end;
- a horn antenna having a flared end facing the flared ends of the plurality of antenna horns, wherein the horn antenna collects electromagnetic radiation from any of the plurality of waveguides sent through any of the plurality of antenna horns;
- a waveguide end of the horn antenna, the waveguide end of the horn antenna having a smaller cross-sectional area than the flared end of the horn antenna; and
- a waveguide-to-coax converter, attached to the waveguide end of the horn antenna, the waveguide-to-coax converter converting electromagnetic radiation carried by any of the plurality of waveguides into an electrical signal sent to the tester.

* * * * *